United States Patent
Ito (10) Patent No.: US 10,784,817 B2
(45) Date of Patent: Sep. 22, 2020

(54) OSCILLATOR, ELECTRONIC APPARATUS AND VEHICLE

(71) Applicant: SEIKO EPSON CORPORATION, Tokyo (JP)

(72) Inventor: Hisahiro Ito, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/665,865

(22) Filed: Oct. 28, 2019

(65) Prior Publication Data

US 2020/0136558 A1 Apr. 30, 2020

(30) Foreign Application Priority Data

Oct. 29, 2018 (JP) .................. 2018-202459

(51) Int. Cl.
| | |
|---|---|
| *H03B 5/32* | (2006.01) |
| *H01L 41/04* | (2006.01) |
| *H01L 23/50* | (2006.01) |
| *H03H 9/02* | (2006.01) |
| *H03H 9/215* | (2006.01) |
| *H01L 23/00* | (2006.01) |

(52) U.S. Cl.
CPC .............. *H03B 5/32* (2013.01); *H01L 23/50* (2013.01); *H01L 24/32* (2013.01); *H01L 24/48* (2013.01); *H01L 24/73* (2013.01); *H01L 41/042* (2013.01); *H03H 9/02023* (2013.01); *H03H 9/02157* (2013.01); *H03H 9/215* (2013.01); *H01L 2224/48091* (2013.01); *H01L 2224/48247* (2013.01); *H01L 2224/73265* (2013.01); *H01L 2924/14* (2013.01)

(58) Field of Classification Search
CPC ....... H03B 5/32; H01L 24/73; H03H 9/02023
See application file for complete search history.

(56) References Cited

U.S. PATENT DOCUMENTS

| | | | |
|---|---|---|---|
| 2016/0285464 A1* | 9/2016 | Obata | ........................ H03L 1/04 |
| 2017/0302224 A1* | 10/2017 | Frenette | ................... H03H 7/06 |
| 2019/0109561 A1* | 4/2019 | Bahr | .................... H03B 5/1296 |

FOREIGN PATENT DOCUMENTS

| | | |
|---|---|---|
| JP | 2000341081 | 12/2000 |
| JP | 2010010480 | 1/2010 |
| WO | 2009157208 | 12/2009 |

\* cited by examiner

*Primary Examiner* — Jeffrey M Shin
(74) *Attorney, Agent, or Firm* — Workman Nydegger (57) ABSTRACT

Provided is an oscillator including a resonator which includes a resonator element and a resonator element container accommodating the resonator element, an integrated circuit element which includes an inductor, and a nonconductive spacer member, in which the resonator and the integrated circuit element are stacked above each other, the resonator has a metal member, and the spacer member is provided between the resonator and the integrated circuit element.

10 Claims, 7 Drawing Sheets

OSCILLATOR, ELECTRONIC APPARATUS AND VEHICLE

The present application is based on, and claims priority from JP Application Serial Number 2018-202459, filed Oct. 29, 2018, the disclosure of which is hereby incorporated by reference herein in its entirety.

BACKGROUND

1. Technical Field

The present disclosure relates to an oscillator, an electronic apparatus, and a vehicle.

2. Related Art

Oscillators that oscillate resonators such as quartz crystal resonators and output signals having desired frequencies have been widely used in various electronic apparatuses and systems. In order to meet requests for miniaturization, the oscillator in which the resonator and an integrated circuit (IC) for oscillating the resonator are stacked is known. For example, JP-A-2010-10480 discloses a semiconductor module in which the quartz crystal resonator and a semiconductor element are stacked on a substrate. In this semiconductor module, an electronic component such as an inductor is mounted on a substrate as a body separate from the quartz crystal resonator and the semiconductor element.

However, in an oscillator in which a resonator and an IC are stacked above each other, the inventor of the present application has found that a new problem occurs when a configuration in which an inductor is built into the IC is adopted for further miniaturization. That is, a magnetic field generated due to a current flowing into the inductor is blocked by a metal member constituting a portion of a quartz crystal resonator, and an eddy current is generated inside the metal member, and as a result, it has been found that there is a concern that a Q value of the inductor is deteriorated and a function as a circuit element is deteriorated.

SUMMARY

An oscillator according to an aspect of the present disclosure includes: a resonator which includes a resonator element and a resonator element container accommodating the resonator element; an integrated circuit element which includes an inductor; and a nonconductive spacer member, in which the resonator and the integrated circuit element are stacked above each other, the resonator has a metal member, and the spacer member is provided between the resonator and the integrated circuit element.

In the oscillator of the aspect, a thickness of the spacer member may be ½ or more of an outer diameter of the inductor.

In the oscillator of the aspect, the resonator element container may include a base provided with a concave portion in which the resonator element is accommodated, and a lid which is the metal member, and the resonator may be mounted over the spacer member such that the lid faces the integrated circuit element.

An oscillator according to another aspect of the present disclosure includes: a resonator which includes a resonator element and a resonator element container accommodating the resonator element; an integrated circuit element which includes an inductor; and a conductive spacer member, in which the resonator and the integrated circuit element are stacked above each other, the resonator has the metal member, the spacer member is provided between the resonator and the integrated circuit element, and electrically couples the resonator and the integrated circuit element to each other, and the spacer member and the inductor do not overlap with each other when viewed in plan view.

In the oscillator of the aspect, the integrated circuit element may include a guard ring provided around the inductor, and the spacer member may not overlap with the guard ring when viewed in plan view.

In the oscillator of the aspect, the resonator element container may include the base provided with the concave portion in which the resonator element is accommodated, and the lid which is the metal member, and the resonator may be mounted over the integrated circuit element through the spacer member such that the base faces the integrated circuit element.

In the oscillator of the aspect, the inductor and the metal member may overlap with each other when viewed in plan view.

In the oscillator of the aspect, the thickness of the spacer member may be 1 millimeter or less.

An electronic apparatus according to another aspect of the present disclosure includes the oscillator.

A vehicle according to another aspect of the present disclosure includes the oscillator.

DESCRIPTION OF EXEMPLARY EMBODIMENTS

Hereinafter, a preferred embodiment of the present disclosure will be described in detail with reference to the accompanying drawings. Note that the embodiment to be described below does not unduly limit the contents of the disclosure described in the appended claims. In addition, all configurations to be described below are not limited to being essential constituent conditions of the disclosure.

1. Oscillator

1-1. First Embodiment

Functional Configuration of Oscillator

Figure 1:
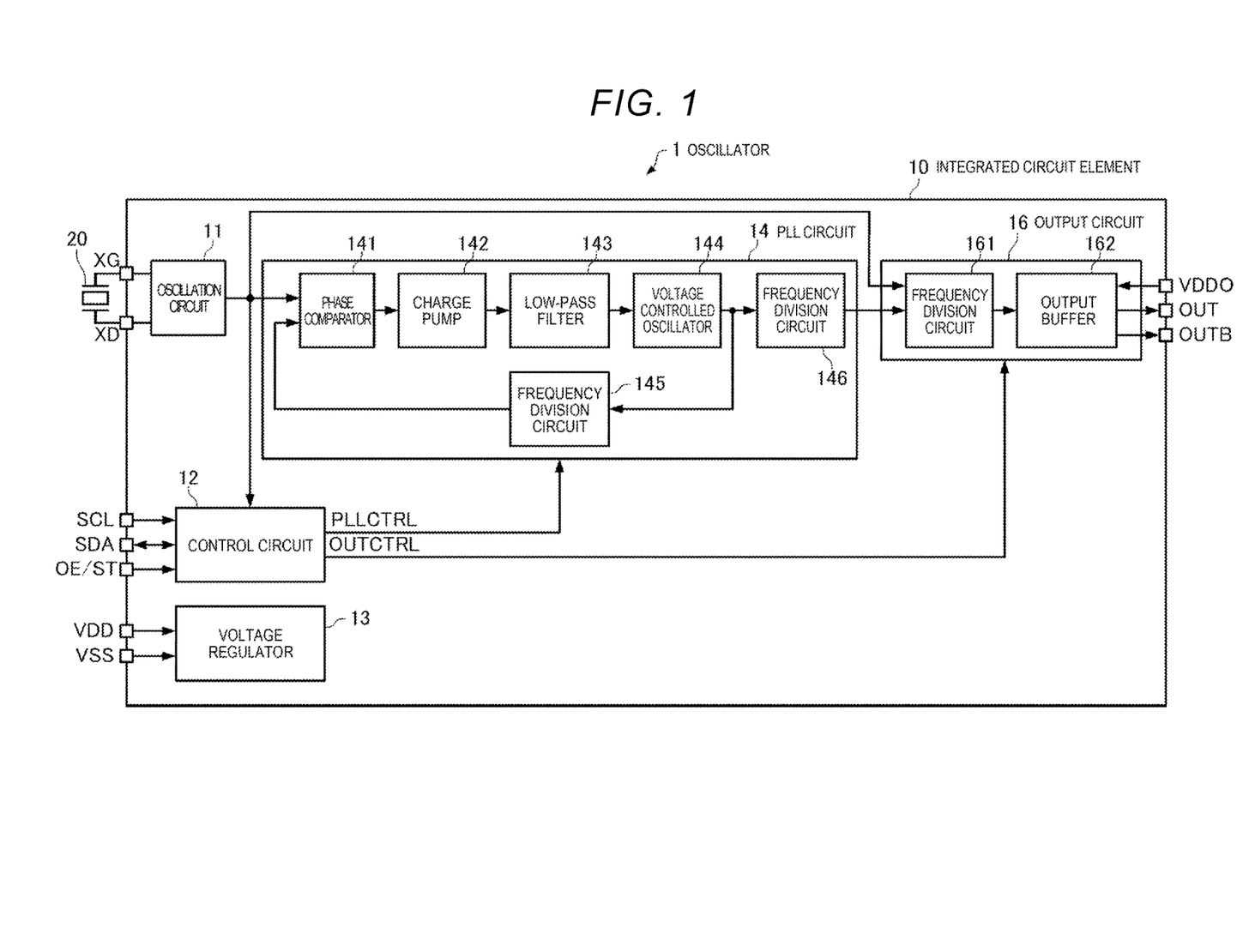
FIG. 1 is a functional block view of an oscillator according to the present embodiment.

FIG. 1 is a functional block view of an oscillator 1 of the present embodiment. As illustrated in FIG. 1, the oscillator 1 of the present embodiment includes an integrated circuit element 10 and a resonator 20.

As the resonator 20, for example, a quartz crystal resonator, a surface acoustic wave (SAW) resonant element, other piezoelectric resonant elements, a micro electro mechanical systems (MEMS) resonator, and the like can be used.

In the present embodiment, the integrated circuit element 10 includes an oscillation circuit 11, a control circuit 12, a voltage regulator 13, a PLL circuit 14, and an output circuit 16. Note that the integrated circuit element 10 may be configured such that some of these components are omitted or changed, or other components are added.

The voltage regulator 13 generates a predetermined voltage with a ground voltage supplied through a VSS terminal as a reference based on a power voltage supplied through a VDD terminal. The voltage generated by the voltage regulator 13 serves as power voltages of the oscillation circuit 11 and the PLL circuit 14.

The oscillation circuit 11 is coupled to one end of the resonator 20 through an XG terminal, and is coupled to the other end of the resonator 20 through an XD terminal. The oscillation circuit 11 oscillates the resonator 20 by amplifying an output signal of the resonator 20 which is input through the XG terminal and feeding back the amplified signal to the resonator 20 through the XD terminal. For example, the oscillation circuit constituted by the resonator 20 and the oscillation circuit 11 may be any of various types of oscillation circuits such as a pierced oscillation circuit, an inverter-type oscillation circuit, a Colpitts oscillation circuit, and a Hartley oscillation circuit.

The PLL circuit 14 is phase-synchronized with an oscillation signal output from the oscillation circuit 11, generates an oscillation signal obtained by multiplying and dividing the frequency of the oscillation signal, and outputs the generated oscillation signal. The number of times of multiplication and a frequency division ratio of the PLL circuit 14 are set in accordance with a control signal PLLCTRL.

In the present embodiment, the PLL circuit 14 is a fractional N-PLL circuit. Specifically, the PLL circuit 14 includes a phase comparator 141, a charge pump 142, a low-pass filter 143, a voltage controlled oscillator 144, a frequency division circuit 145, and a frequency division circuit 146.

The phase comparator 141 compares a phase difference between an oscillation signal output by the oscillation circuit 11 and an oscillation signal output by the frequency division circuit 145, and outputs a comparison result as a pulse voltage.

The charge pump 142 converts a pulse voltage output by the phase comparator 141 into a current, and the low-pass filter 143 smoothens the current output by the charge pump 142 and converts the smoothened current into a voltage.

The voltage controlled oscillator 144 outputs an oscillation signal of which the frequency changes depending on an output voltage of the low-pass filter 143. In the present embodiment, the voltage controlled oscillator 144 is realized by an LC oscillation circuit constituted using an inductor and a variable capacity element.

The frequency division circuit 145 outputs an oscillation signal, obtained by performing integer frequency division on an oscillation signal output by the voltage controlled oscillator 144, at a frequency division ratio which is set in accordance with the control signal PLLCTRL. In the present embodiment, a frequency division ratio of the frequency division circuit 145 changes to a plurality of integer values in a range around an integer value N in time series, and a time average value thereof is N+F/M. Therefore, in a normal state where the phase of an oscillation signal output from the oscillation circuit 11 and the phase of an oscillation signal output from the frequency division circuit 145 are synchronized with each other, a frequency $f_{vco}$ of the oscillation signal output from the voltage controlled oscillator 144 and a frequency $f_{osc}$ of the oscillation signal output from the oscillation circuit 11 satisfy a relationship of Expression (1).

$$f_{VCO} = \left(N + \frac{F}{M}\right) \times f_{OSC} \qquad (1)$$

The frequency division circuit 146 outputs an oscillation signal, obtained by performing integer frequency division on the oscillation signal output by the voltage controlled oscillator 144, at a frequency division ratio which is set in accordance with the control signal PLLCTRL.

The output circuit 16 outputs a signal based on the oscillation signal output from the PLL circuit 14. Specifically, to the output circuit 16, the oscillation signal output from the oscillation circuit 11 is input, and the oscillation signal output from the frequency division circuit 146 of the PLL circuit 14 is input. Then, the output circuit 16 generates an oscillation signal obtained by performing frequency-division on one oscillation signal selected from the input two types of oscillation signals, and outputs the generated oscillation signal in a selected output format. The selection of an oscillation signal and an output format and the setting of a frequency division ratio on the output circuit 16 are performed in accordance with the control signal OUTCTRL.

In the present embodiment, the output circuit 16 includes a frequency division circuit 161 and an output buffer 162.

The frequency division circuit 161 selects any one of the oscillation signal output from the oscillation circuit and the oscillation signal output from the frequency division circuit 146 of the PLL circuit 14 in accordance with the control signal OUTCTRL, and outputs an oscillation signal obtained by performing frequency-division on the selected oscillation signal at a frequency division ratio set in accordance with the control signal OUTCTRL.

The output buffer 162 converts the oscillation signal output from the frequency division circuit 161 into an oscillation signal in an output format selected in accordance with the control signal OUTCTRL, based on a power voltage supplied through a VDDO terminal, and outputs the converted oscillation signal to the outside of the integrated circuit element 10 through at least one of an OUT terminal and an OUTB terminal. For example, the output buffer 162 outputs a differential oscillation signal through the OUT terminal and the OUTB terminal when a differential output such as a positive emitter coupled logic (PECL) output, a low voltage differential signaling (LVDS) output, or a high-speed current steering logic (HCSL) output is selected as an output format. Further, the output buffer 162 outputs a single-ended oscillation signal through the OUT terminal and the OUTB terminal when a single-ended output such as a complementary metal oxide semiconductor (CMOS) output is selected as an output format. Note that the output of an oscillation signal or the stop of output of an oscillation signal by the output buffer 162 is controlled in accordance with the control signal OUTCTRL.

The control circuit 12 generates the above-described control signal PLLCTRL and control signal OUTCTRL. Specifically, the control circuit 12 has an interface circuit corresponding to an inter-integrated circuit (I²C) bus and a storage circuit, receives a serial data signal input through a SDA terminal in synchronization with a serial clock signal input through SCL terminal from an external device not illustrated in the drawing, and stores various pieces of data in the storage circuit in accordance with the received serial data. The control circuit 12 generates the control signal PLLCTRL and the control signal OUTCTRL based on the various pieces of data stored in the storage circuit. Note that the interface circuit included in the control circuit 12 is not limited to an interface circuit corresponding to an I²C bus, and may be, for example, an interface circuit corresponding to a serial peripheral interface (SPI) bus.

Figure 2:
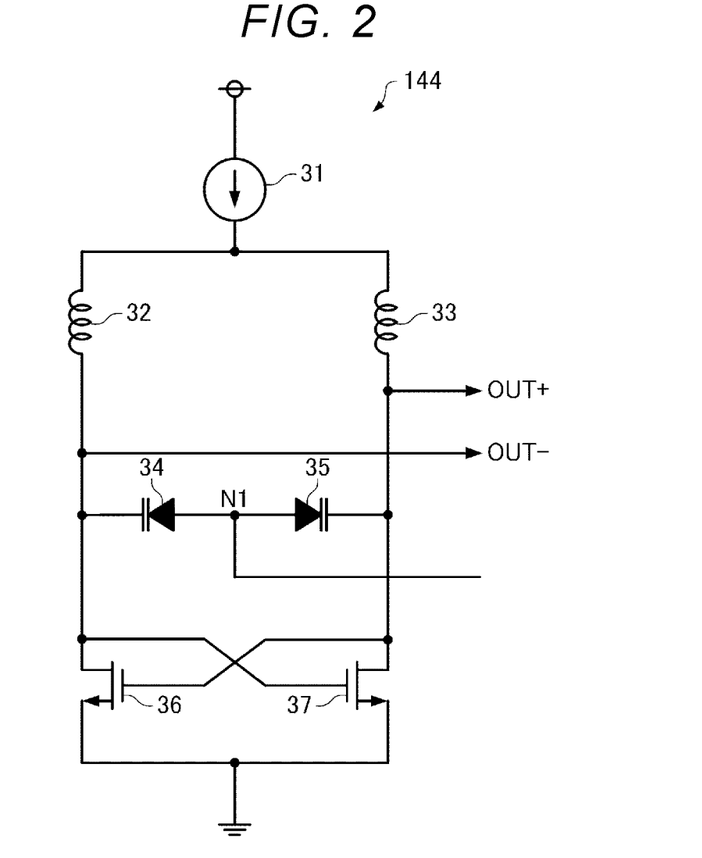
FIG. 2 is a view illustrating a configuration example of a voltage controlled oscillator.

FIG. 2 is a view illustrating a configuration example of the voltage controlled oscillator 144. The voltage controlled oscillator 144 illustrated in FIG. 2 includes a current source 31, inductors 32 and 33, variable capacity diodes 34 and 35 which are variable capacity elements, and N-channel type MOS transistors 36 and 37. Further, the voltage controlled oscillator 144 outputs the oscillation signal generated by an oscillation stage constituted by the N-channel type MOS transistors 36 and 37 as differential signals OUT+ and OUT−, for example. An output voltage of the low-pass filter 143 is applied to a node N1 to which the anode of the variable capacity diode 34 and the anode of the variable capacity diode 35 are coupled, and capacitance values of the variable capacity diodes 34 and 35 change depending on a voltage of the node N1. The frequency of the oscillation signal output from the voltage controlled oscillator 144 is determined in accordance with inductance values of the inductors 32 and 33 and the capacitance values of the variable capacity diodes 34 and 35.

The oscillator 1 of the present embodiment configured as described above generates and outputs oscillation signals having a plurality of types of frequencies according to a setting based on an oscillation signal output from the resonator 20, and can be used as a clock signal generation device.

Structure of Oscillator

Figure 3:
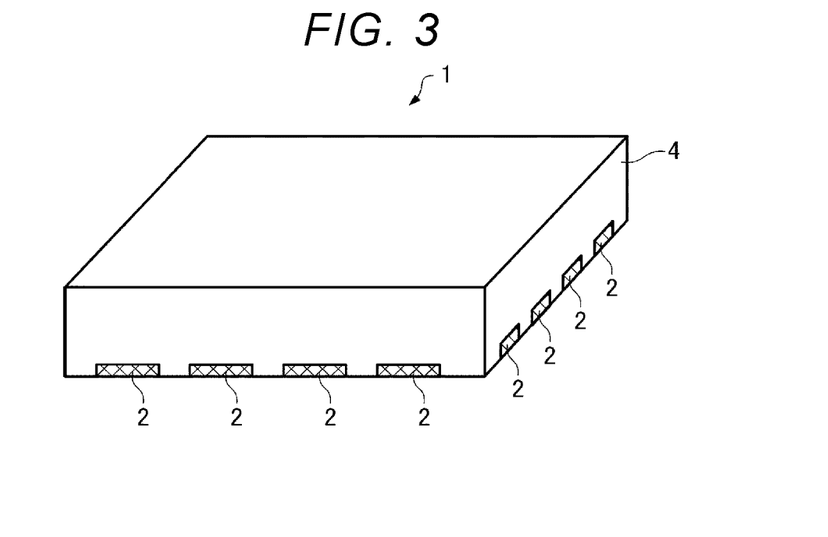
FIG. 3 is a perspective view of the oscillator of the present embodiment.
Figure 4:
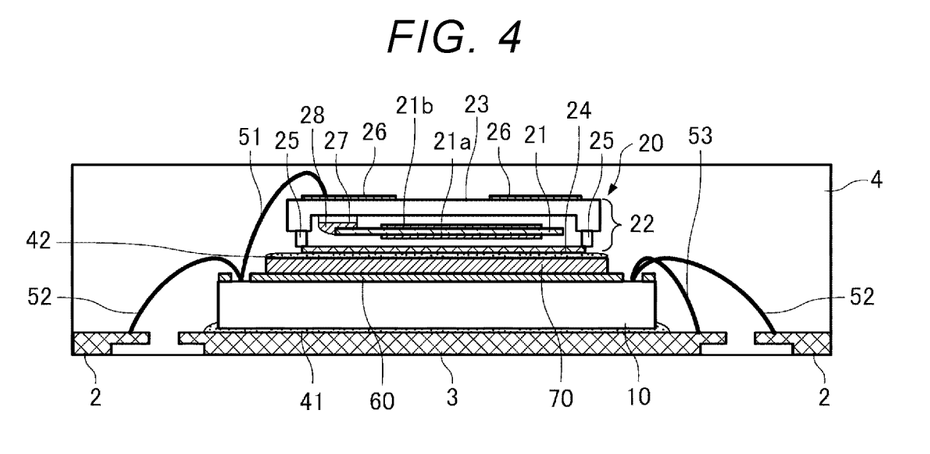
FIG. 4 is a side view of an oscillator of a first embodiment.

FIGS. 3 and 4 are views illustrating an example of a structure of the oscillator 1 of the first embodiment. FIG. 3 is a perspective view of the oscillator 1 and FIG. 4 is a side view of the oscillator 1. FIG. 4 is illustrated in a state of seeing through a mold resin 4, the container of the resonator 20, and the like for the sake of convenience.

As illustrated in FIGS. 3 and 4, the oscillator 1 of the first embodiment has a structure in which the integrated circuit element 10 and the resonator 20 are sealed by the mold resin 4, for example, a quad flat non lead (QFN) package structure, and is formed into a low rectangular parallelepiped as a whole. A plurality of metal electrodes 2 are provided on each side surface of the oscillator 1. Each electrode 2 is also exposed to peripheral portions of the bottom surface of the oscillator 1.

As illustrated in FIG. 4, the integrated circuit element 10 is mounted on a metal pedestal 3, and the integrated circuit element 10 and the pedestal 3 are fixed by an adhesive 41. The bottom surface of the pedestal 3 is exposed to the bottom surface of the oscillator 1. The pedestal 3 is, for example, grounded.

As illustrated in FIG. 4, the resonator 20 includes a resonator element 21 and a resonator element container 22 accommodating the resonator element 21. The resonator element container 22 includes a base 23 provided with a concave portion in which the resonator element 21 is accommodated, a lid 24 which is a metal member, and a seaming ring 25 for bonding the base 23 and the lid 24 to each other. The member of the base 23 is, for example, ceramics. The member of the lid 24 is, for example, Kovar.

The resonator element 21 is a member having a thin plate shape, and has metal excitation electrodes 21a and 21b respectively provided on both surfaces thereof. The resonator element 21 is firmly fixed to a metal electrode 27 provided in the base 23 by a conductive adhesive 28, and oscillates at a desired frequency based on the shape and mass of the resonator element 21 including the excitation electrodes 21a and 21b. As a material of the resonator element 21, a piezoelectric material, for example, piezoelectric single crystals such as quartz crystal, lithium tantalate, and lithium niobate, or piezoelectric ceramics such as zirconate titanate, a silicon semiconductor material, or the like can be used. Further, as excitation means of the resonator element 21, excitation means using a piezoelectric effect may be used, or electrostatic driving using a Coulomb force may be used.

As illustrated in FIG. 4, a coating member 60 for protecting an internal circuit of the integrated circuit element 10 is applied to the upper surface of the integrated circuit element 10. The material of the coating member 60 is, for example, polyimide. A nonconductive spacer member 70 is provided on the upper surface of the integrated circuit element 10 with the coating member 60 interposed therebetween. The material of the spacer member 70 may be, for example, a synthetic resin such as polyimide. The spacer member 70 may be, for example, a material in which tapes made of a synthetic resin such as polyimide are stacked, or may be a material formed by spin-coating a synthetic resin such as polyimide.

The spacer member 70 is provided between the resonator 20 and the integrated circuit element 10. Specifically, the resonator 20 is mounted on the upper surface of the spacer member 70, and the lid 24 of the resonator 20 and the spacer member 70 are fixed by the adhesive 42. That is, the resonator 20 is mounted on the spacer member 70 such that the lid 24 faces the integrated circuit element 10.

As illustrated in FIG. 4, a plurality of electrodes 26 are provided on the outer surface of the resonator element container 22 of the resonator 20, that is, the outer surface of the base 23. Among the electrodes, two electrodes 26 are electrically coupled to the excitation electrodes 21a and 21b of the resonator element 21 respectively by wiring (not illustrated) provided on the base 23.

One electrode 26 is bonded to a pad serving as an XG terminal provided on the upper surface of the integrated circuit element 10 by a wire 51 made of gold or the like. The other one electrode 26 is bonded to a pad serving as an XD terminal provided on the upper surface of the integrated circuit element 10 by the other wire 51 (not illustrated).

Some other pads provided on the upper surface of the integrated circuit element 10 are bonded to the respective electrodes 2 by wires 52 made of gold or the like. Further, a pad serving as a VSS terminal provided on the upper surface of the integrated circuit element 10 is bonded to the pedestal 3 by a wire 53 made of gold or the like.

As described above, in the oscillator 1 of the present embodiment, the resonator 20 and the integrated circuit element 10 are stacked above each other, and miniaturization is realized.

Internal Disposition of Integrated Circuit Element

Figure 5:
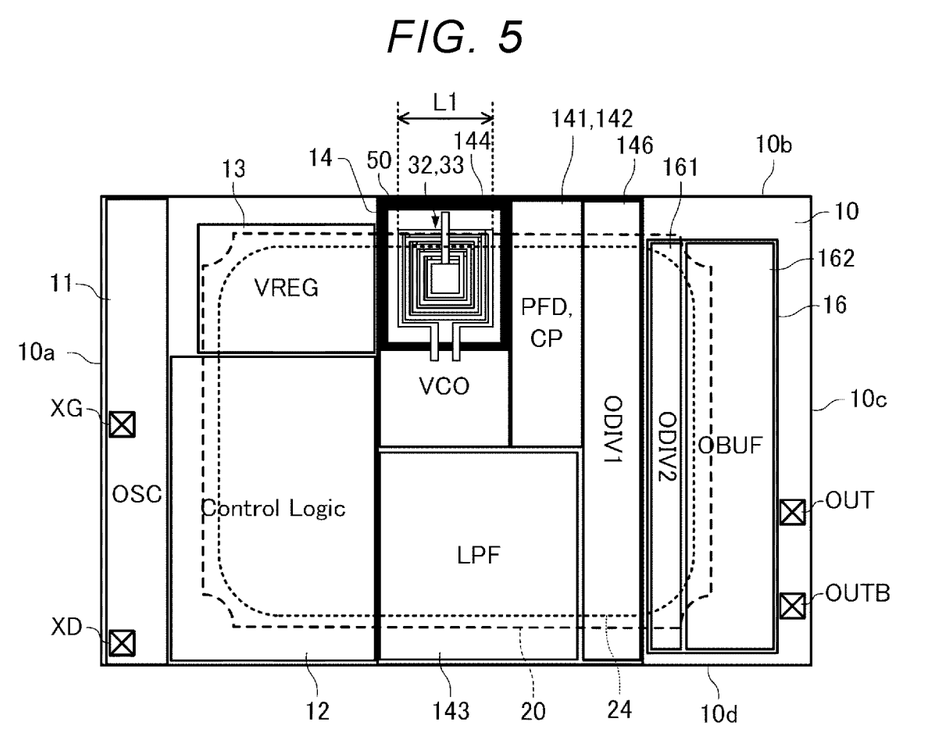
FIG. 5 is a view illustrating an example of an internal disposition of an integrated circuit element in the oscillator of the first embodiment.

FIG. 5 is a view illustrating an example of the internal disposition of the integrated circuit element 10 in the oscillator 1 of the first embodiment, and is a plan view of the integrated circuit element 10 when the oscillator 1 is viewed from the upper surface. FIG. 5 illustrates the disposition of each circuit included in the integrated circuit element 10 and a pad functioning as some terminals. Further, in FIG. 5, the resonator 20 is illustrated by a broken line. In FIG. 5, "OSC" is an oscillation circuit 11, "Control Logic" is a control circuit 12, and "VREG" is a voltage regulator 13. Further, "PFD" is a phase comparator 141, "CP" is a charge pump 142, "LPF" is a low-pass filter 143, "VCO" is a voltage controlled oscillator 144, and "ODIV1" is a frequency division circuit 146. "ODIV2" is a frequency division circuit 161 and "OBUF" is an output buffer 162.

As illustrated in FIG. 5, the integrated circuit element 10 has a rectangular shape having four sides 10a, 10b, 10c, and 10d when viewed in plan view.

The oscillation circuit 11 is disposed in the vicinity of the side 10a of the integrated circuit element 10 when viewed in plan view of the oscillator 1 or the integrated circuit element 10. A pad functioning as an XG terminal is provided along the side 10a of the integrated circuit element 10. Similarly, a pad functioning as an XD terminal is provided along the side 10a of the integrated circuit element 10. Therefore, according to the oscillator 1 of the present embodiment, an oscillation signal generated based on a signal input from the XG terminal in the oscillation circuit 11 propagates through a short wiring and is output from the XD terminal, and is thus unlikely to be influenced by noise.

The voltage regulator 13 is disposed between the oscillation circuit 11 and the PLL circuit 14 when viewed in plan view of the oscillator 1 or the integrated circuit element 10. In addition, the control circuit 12 is disposed between the oscillation circuit 11 and the PLL circuit 14.

Further, the PLL circuit 14 is disposed between the oscillation circuit 11 and the output circuit 16 when viewed in plan view of the oscillator 1 or the integrated circuit element 10.

In addition, the output circuit 16 is disposed in the vicinity of the side 10c facing the side 10a of the integrated circuit element 10 when viewed in plan view of the oscillator 1 or the integrated circuit element 10. A pad functioning as an OUT terminal or an OUTB terminal and electrically coupled to the output circuit 16 is provided along the side 10c.

Here, an oscillation signal generated by the oscillation circuit 11 propagates to the PLL circuit 14 and propagates to the output circuit 16, and a signal based on the oscillation signal is output from the OUT and the OUTB terminals. Therefore, in the oscillator 1 of the present embodiment, as illustrated in FIG. 5, each of the circuits and each of the pads are disposed so as to be matched to a flow of such a signal, so that various signals flow in substantially one direction toward the side 10c from the side 10a and each of the wirings through which the various signals propagate is shortened. Accordingly, noise superimposed on each signal due to crosstalk with other signals or the like is reduced. Further, each wiring is shortened, and thus a wiring region becomes smaller as a whole, and thus the area of the integrated circuit element 10 is reduced.

Further, in the present embodiment, the inductors 32 and 33 included in the voltage controlled oscillator 144 of the PLL circuit 14 are provided in the vicinity of the side 10b. A guard ring 50 which is a fixed voltage, for example, a ground voltage, is provided in the vicinity of the inductors 32 and 33. Then, the resonator 20 indicated by a broken line overlaps with the inductors 32 and 33 when viewed in plan view of the oscillator 1. That is, the inductors 32 and 33 overlap with the lid 24 or the excitation electrodes 21a and 21b which are metal members included in the resonator 20.

Therefore, when a distance between the resonator 20 and the integrated circuit element 10 is short, the magnetic field generated by the current flowing through the inductors 32 and 33 is blocked by the metal member of the resonator 20 and an eddy current is generated in the metal member. As a result, the Q values of the inductors 32 and 33 deteriorate, and the function as a circuit element deteriorates.

On the other hand, in the present embodiment, since the spacer member 70 is provided between the resonator 20 and the integrated circuit element 10, the resonator 20 and the integrated circuit element 10 are separated by the thickness of the spacer member 70. Therefore, the magnetic field generated by the current flowing through the inductors 32 and 33 is less likely to be blocked by the metal member of the resonator 20, and the eddy current is less likely to be generated in the metal member. As a result, deterioration of the Q values of the inductors 32 and 33 is reduced, and the possibility of deterioration of the function as a circuit element is reduced.

Figure 6:
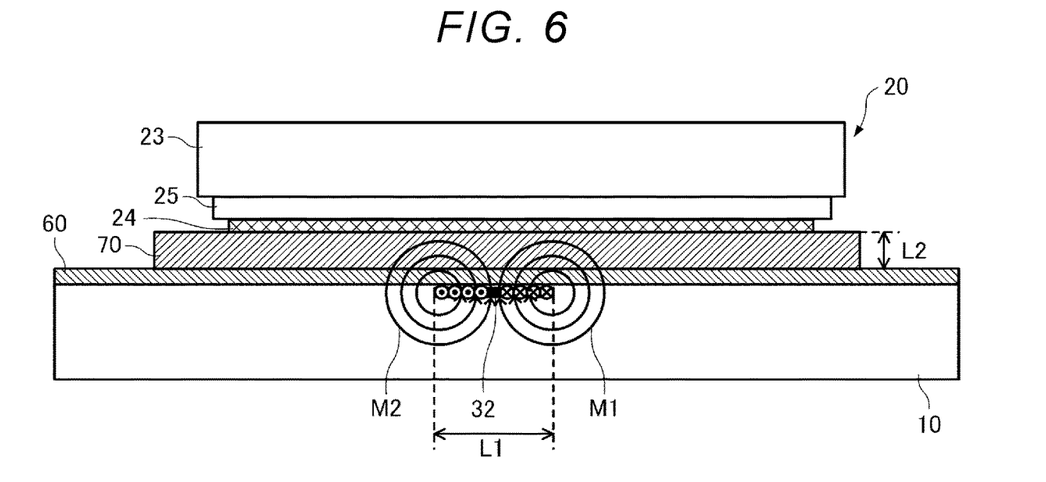
FIG. 6 is a view of the integrated circuit element, a spacer member, and a resonator as viewed from a side surface of the oscillator.

FIG. 6 is a view of the integrated circuit element 10, the spacer member 70, and the resonator 20 illustrated in FIG. 4 as viewed from the side surface of the oscillator 1. For convenience, the inductor 32 inside the integrated circuit element 10 is also illustrated. In FIG. 6, a current flows from a front to a deeper part of the right side of the inductor 32, and a clockwise magnetic field M1 is generated by the current. Further, a current flows from the deeper part to the front of the left side of the inductor 32, and a counterclockwise magnetic field M2 is generated by the current.

As the number of turns of the inductor 32 increases, the generated magnetic fields M1 and M2 increase, and the outer diameter L1 of the inductor 32 increases. That is, there is a correlation between the outer diameter L1 of the inductor 32 and the magnitudes of the magnetic fields M1 and M2, and the magnetic fields M1 and M2 become larger as the outer diameter L1 of the inductor 32 becomes larger. Therefore, in order to reduce the deterioration of the Q values of the inductors 32 and 33 due to the magnetic fields M1 and M2, it is preferable that the distance between the resonator 20 and the integrated circuit element 10 may be increased by increasing the thickness L2 of the spacer member 70. The same is applied to the inductor 33. The outer diameter L1 of the inductors 32 and 33 is, for example, the length of the longest side of a rectangle when the contour of the inductors 32 and 33 is a form of the rectangle, and is the length of the major axis of an ellipse when the contour of the inductors 32 and 33 is a form of the ellipse.

Figure 7:
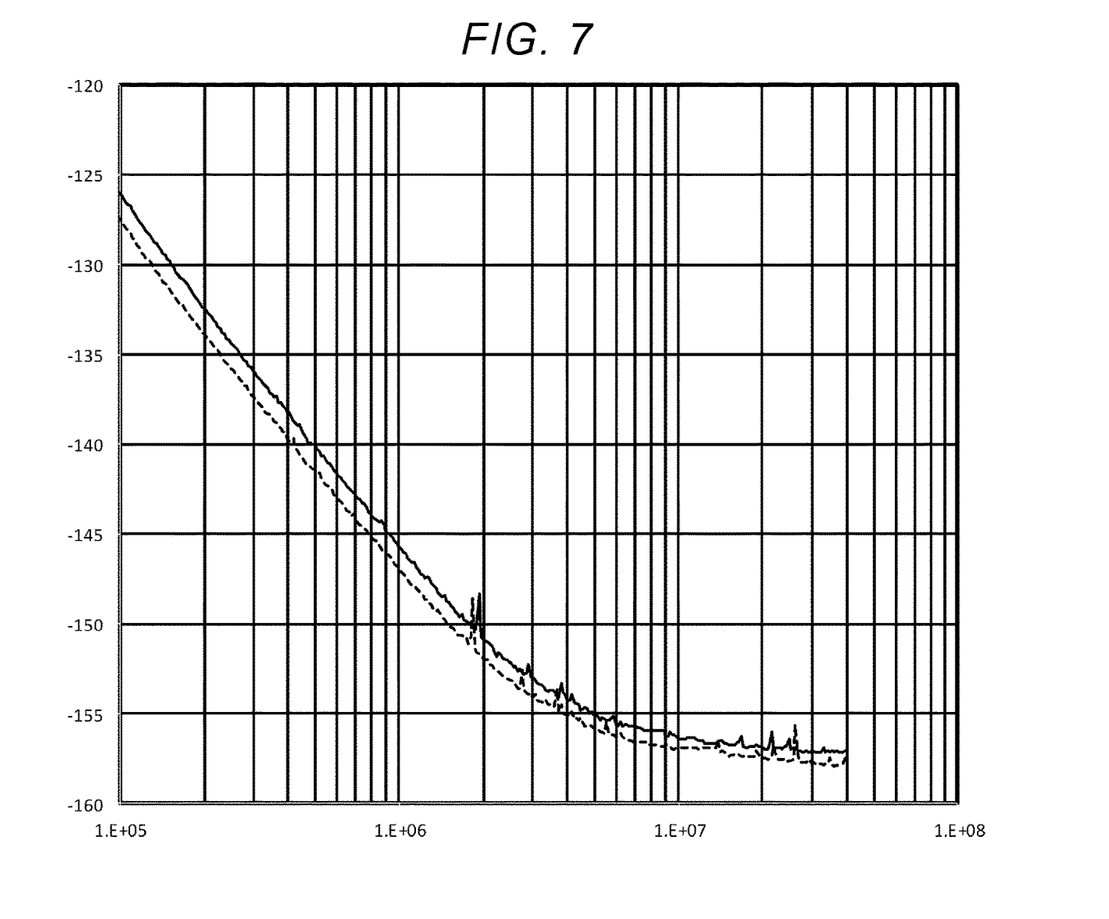
FIG. 7 is a view illustrating phase noise of an oscillation signal in an oscillator of a comparative example.
Figure 8:
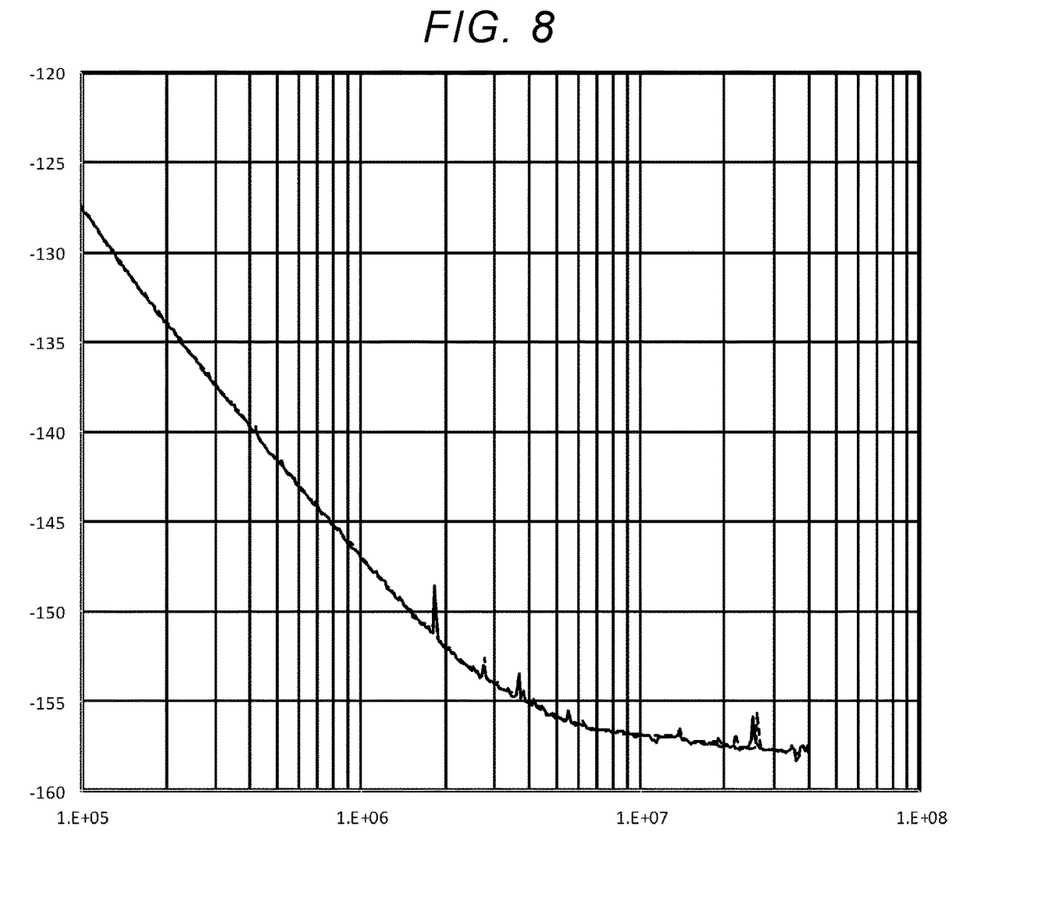
FIG. 8 is a view illustrating phase noise of an oscillation signal in the oscillator of the first embodiment.

In FIG. 7, the phase noise of the oscillation signal is indicated by a solid line, in the oscillator of the comparative example in which the resonator 20 is mounted on the upper surface of the integrated circuit element 10 so that the spacer member 70 is not present and the lid 24 of the resonator 20 is on the upper surface. Further, in FIG. 8, the phase noise of the oscillation signal is indicated by a solid line in the oscillator 1 when the outer diameter L1 of the inductors 32 and 33 is 340 μm and the thickness of the spacer member 70 is 200 μm. In FIGS. 7 and 8, the horizontal axis is frequency, and the vertical axis is the magnitude of phase noise. Note that in FIGS. 7 and 8, the broken line indicates the phase noise of the oscillation signal when the resonator 20 is not mounted on the upper surface of the integrated circuit element 10, that is, an ideal phase noise.

Although the distance between the lid 24 and the inductors 32 and 33 is large in the oscillator of the comparative example, since the distance between the excitation electrodes 21a and 21b, and the inductors 32 and 33 is small, as illustrated in FIG. 7, the phase noise of the oscillator of the comparative example is more deteriorating than the ideal phase noise.

On the other hand, as illustrated in FIG. 8, the phase noise of the oscillator 1 of the present embodiment is almost the same as the ideal phase noise. From the results illustrated in FIG. 8, the phase noise of the oscillator 1 in which the outer diameter L1 of the inductors 32 and 33 is 340 μm and the thickness of the spacer member 70 is 170 μm is equivalent to that of the ideal phase noise or, is considered to be better than the phase noise of the oscillator of the comparative example at worst. In general, in the oscillator 1 of the present embodiment, in order to sufficiently reduce the magnetic fields M1 and M2 blocked by the metal members of the resonator 20, the thickness L2 of the spacer member 70 is preferably ½ or more of the outer diameter L1 of the inductors 32 and 33. However, as the thickness L2 of the spacer member 70 is increased, the height of the oscillator 1 is increased, which may not satisfy the constraints of the package size such as QFN, so the thickness L2 of the spacer member 70 is 1 mm or less is preferred.

Operational Effects of Present Embodiment

In the oscillator 1 according to the first embodiment described above, the resonator 20 and the integrated circuit element 10 are stacked above each other, and the nonconductive spacer member 70 is provided between the resonator 20 and the integrated circuit element 10. Specifically, the resonator 20 is mounted on the spacer member 70 such that the lid 24 faces the integrated circuit element 10. Therefore, the distance between the lid 24 which is a metal member included in the resonator 20 and the inductors 32 and 33 included in the integrated circuit element 10 is increased by the thickness of the spacer member 70. As a result, even when the lid 24 and the inductors 32 and 33 overlap with each other when viewed in plan view of the oscillator 1, the magnetic field generated by the current flowing through the inductors 32 and 33 is less likely to be blocked by the lid 24 and the eddy current is less likely to be generated in the lid 24. Therefore, according to the oscillator 1 of the first embodiment, the deterioration of the Q values of the inductors 32 and 33 is reduced, and the possibility of deterioration of the function as a circuit element is reduced. In particular, by setting the thickness of the spacer member 70 to ½ or more of the outer diameter of the inductors 32 and 33, the deterioration of the Q values of the inductors 32 and 33 are largely reduced.

Further, in the oscillator 1 according to the first embodiment, the metal members of the resonator 20 and the inductors 32 and 33 may be disposed so as to overlap with each other when viewed in plan view of the oscillator 1, so that it is possible to reduce the area of the integrated circuit element 10. Therefore, according to the first embodiment, miniaturizing of the oscillator 1 can be realized.

Further, in the oscillator 1 of the first embodiment, an output signal of the oscillation circuit 11 propagates to the PLL circuit 14, and an oscillation signal output from the PLL circuit 14 propagates to the output circuit 16. That is, a signal input to the integrated circuit element 10 from one electrode 26 of the resonator 20 through a pad functioning as an XG terminal propagates toward the side 10c from the side 10a, and is output through each pad functioning as the OUT terminal or the OUTB terminal. Further, the PLL circuit 14 is disposed between the oscillation circuit 11 and the output circuit 16 so as to be matched to flows of such various signals in the integrated circuit element 10, and thus each of the wirings through which the various signals propagate is shortened. Therefore, according to the oscillator 1 of the first embodiment, parasitic capacitance of each wiring is reduced, and noise superimposed on each signal due to crosstalk with other signals or the like is reduced. Further, each wiring is shortened, and thus a wiring region becomes smaller as a whole, and thus the area of the integrated circuit element 10 is reduced.

Further, according to the first embodiment, since the two electrodes 26 provided on the outer surface of the base 23 of the resonator 20, and a pad functioning as an XG terminal and a pad functioning as an XD terminal provided on the integrated circuit element 10 can be coupled by wire bonding respectively, mounting of the oscillator 1 is easy.

1-2. Second Embodiment

Hereinafter, with regard to the oscillator 1 of a second embodiment, the same components as those of the first embodiment are given the same reference numerals, the description overlapping with the first embodiment is omitted or simplified, and the contents different from the first embodiment will be mainly described.

The functional block view of the oscillator 1 of the second embodiment is the same as that of FIG. 1, and therefore the illustration and description thereof will be omitted. Further, since the perspective view of the oscillator 1 of the second embodiment is the same as that of FIG. 3, the illustration and description thereof will be omitted.

Figure 9:
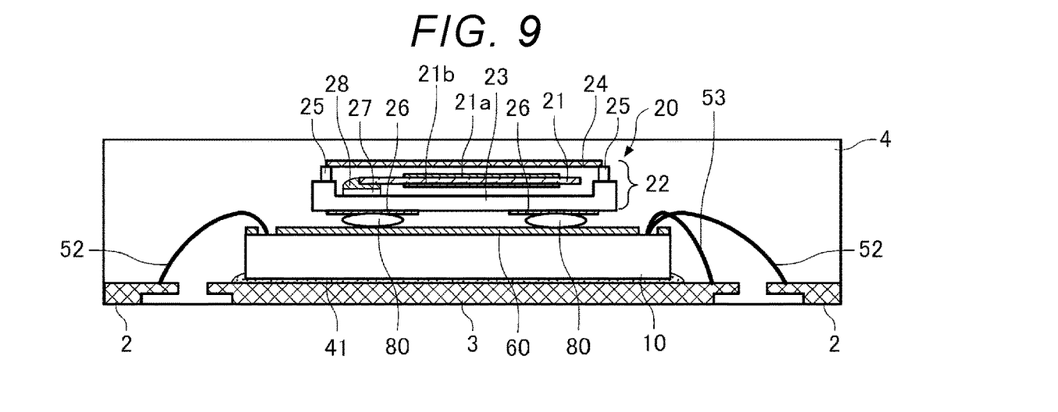
FIG. 9 is a side view of an oscillator of a second embodiment.

FIG. 9 is a side view of the oscillator 1 of a second embodiment. FIG. 9 is illustrated in a state of seeing through a mold resin 4, the container of the resonator 20, and the like for the sake of convenience. As illustrated in FIG. 9, the oscillator 1 of the second embodiment has a structure in which the integrated circuit element 10 and the resonator 20 are sealed by the mold resin 4 as in the first embodiment, for example, the QFN package structure, and is formed into a low rectangular parallelepiped as a whole. A plurality of metal electrodes 2 are provided on each side surface of the oscillator 1. Each electrode 2 is also exposed to peripheral portions of the bottom surface of the oscillator 1.

Further, as in the first embodiment, the integrated circuit element 10 is mounted on the metal pedestal 3, and the integrated circuit element 10 and the pedestal 3 are fixed by an adhesive 41. The bottom of the pedestal 3 is exposed to the bottom of the oscillator 1. The pedestal 3 is grounded, for example.

Further, as in the first embodiment, the resonator 20 includes a resonator element 21 and a resonator element container 22 accommodating the resonator element 21. The resonator element container 22 includes a base 23 provided with a concave portion in which the resonator element 21 is accommodated, a lid 24 which is a metal member, and a seaming ring 25 for bonding the base 23 and the lid 24 to each other.

Further, as in the first embodiment, the resonator element 21 is a member having a thin plate shape, and has metal excitation electrodes 21a and 21b respectively provided on both surfaces thereof. The resonator element 21 is firmly fixed to a metal electrode 27 provided in the base 23 by a conductive adhesive 28, and oscillates at a desired frequency based on the shape and mass of the resonator element 21 including the excitation electrodes 21a and 21b. A plurality of electrodes 26 are provided on the outer surface of the resonator element container 22 of the resonator 20, that is, the outer surface of the base 23. Among the electrodes, two electrodes 26 are electrically coupled to the excitation electrodes 21a and 21b of the resonator element 21 respectively by wiring (not illustrated) provided on the base 23.

As in the first embodiment, a coating member 60 for protecting an internal circuit of the integrated circuit element 10 is applied to the upper surface of the integrated circuit element 10.

In the oscillator 1 of the second embodiment, unlike the first embodiment, a plurality of conductive spacer members 80 are provided on the upper surface of the integrated circuit element 10 with the coating member 60 interposed therebetween. The material of the spacer member 80 may be, for example, various metals or alloys.

The spacer member 80 is provided between the resonator 20 and the integrated circuit element 10 and electrically couples the resonator 20 and the integrated circuit element 10 to each other. Specifically, the resonator 20 is mounted on the upper surfaces of the plurality of spacer members 80, and the plurality of electrodes 26 provided on the outer surface of the base 23 of the resonator 20 and the plurality of spacer members 80 are respectively bonded to each other. That is, the resonator 20 is mounted on the spacer member 80 such that the base 23 faces the integrated circuit element 10. The spacer member 80 may be, for example, a gold bump or a solder ball.

One electrode 26 is bonded to a pad that functions as an XG terminal provided on the upper surface of the integrated circuit element 10 by one of the spacer members 80. The other one of electrode 26 is bonded to a pad that functions as an XD terminal provided on the upper surface of the integrated circuit element 10 by the other one of the spacer members 80.

Some other pads provided on the upper surface of the integrated circuit element 10 are bonded to the respective electrodes 2 by wires 52 made of gold or the like. Further, a pad serving as a VSS terminal provided on the upper surface of the integrated circuit element 10 is bonded to the pedestal 3 by a wire 53 made of gold or the like.

As described above, in the oscillator 1 of the present embodiment, the resonator 20 and the integrated circuit element 10 are stacked above each other, and miniaturization is realized.

Figure 10:
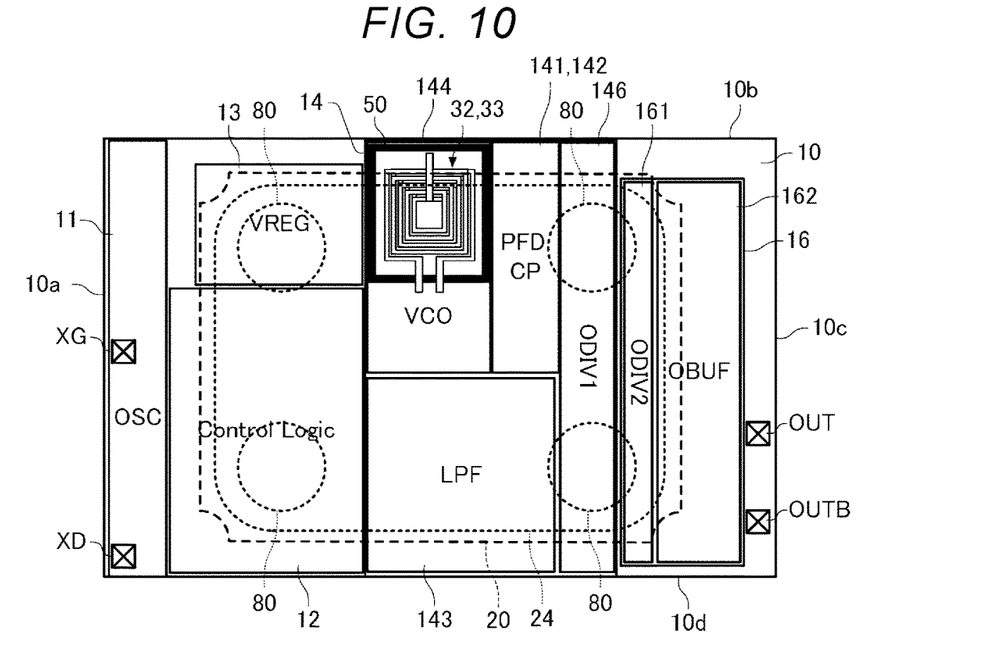
FIG. 10 is a view illustrating an example of an internal disposition of the integrated circuit element in the oscillator of the second embodiment.

FIG. 10 is a view illustrating an example of the internal disposition of the integrated circuit element 10 in the oscillator 1 of the second embodiment, and is a plan view of the integrated circuit element 10 when the oscillator 1 is viewed from the upper surface. FIG. 10 illustrates the disposition of each circuit included in the integrated circuit element 10 and a pad functioning as some terminals. Further, in FIG. 10, the resonator 20 is illustrated by a broken line. Note that in FIG. 10, the same components as in FIG. 5 are denoted by the same reference numerals. As illustrated in FIG. 10, since the disposition of each circuit in the integrated circuit element 10 is the same as that in FIG. 5, description thereof will be omitted.

As illustrated in FIG. 10, the resonator 20 indicated by a broken line overlaps with the inductors 32 and 33 when viewed in plan view of the oscillator 1. That is, the inductors 32 and 33 overlap with the lid 24 or the excitation electrodes 21a and 21b which are metal members included in the resonator 20.

Therefore, when a distance between the resonator 20 and the integrated circuit element 10 is short, the magnetic field generated by the current flowing through the inductors 32 and 33 is blocked by the metal member of the resonator 20 and an eddy current is generated in the metal member. As a result, the Q values of the inductors 32 and 33 deteriorate, and the function as a circuit element deteriorates.

On the other hand, in the present embodiment, since the spacer member 80 is provided between the resonator 20 and the integrated circuit element 10, the resonator 20 and the integrated circuit element 10 are separated by the thickness of the spacer member 80. Therefore, the magnetic field generated by the current flowing through the inductors 32 and 33 is less likely to be blocked by the metal member of the resonator 20, and the eddy current is less likely to be generated in the metal member. As a result, deterioration of the Q values of the inductors 32 and 33 is reduced, and the possibility of deterioration of the function as a circuit element is reduced.

Furthermore, the spacer member 80 and the inductors 32 and 33 do not overlap with each other when viewed in plan view of the oscillator 1. Furthermore, when viewed in plan view of the oscillator 1, the spacer member 80 does not overlap with the fixed voltage guard ring 50 provided around the inductors 32 and 33. That is, the distance between the spacer member 80 and the inductors 32 and 33 is large. Therefore, the magnetic field generated by the current flowing through the inductors 32 and 33 is less likely to be blocked by the conductive spacer member 80, and the eddy current is less likely to be generated in the spacer member 80. As a result, deterioration of the Q values of the inductors 32 and 33 is reduced, and the possibility of deterioration of the function as a circuit element is reduced.

Note that in order to further reduce the deterioration of the Q values of the inductors 32 and 33 due to the magnetic fields generated by the current flowing through the inductors 32 and 33, the distance between the resonator 20 and the integrated circuit element 10 may be increased by increasing the thickness of the spacer member 80. However, as the thickness of the spacer member 80 is increased, the height of the oscillator 1 is increased, which may not satisfy the constraints of the package size such as QFN, so the thickness L2 of the spacer member 80 with 1 mm or less is preferred.

In the oscillator 1 according to the second embodiment described above, the resonator 20 and the integrated circuit element 10 are stacked above each other, and the conductive spacer member 80 is provided between the resonator 20 and the integrated circuit element 10. Specifically, the resonator 20 is mounted on the integrated circuit element 10 through the spacer member 80 such that the base 23 faces the integrated circuit element 10. Therefore, the distance between the metal member included in the resonator 20 and the inductors 32 and 33 included in the integrated circuit element 10 is increased by the thickness of the spacer member 80. As a result, even when the metal member of the resonator 20 and the inductors 32 and 33 overlap with each other when viewed in plan view of the oscillator 1, the magnetic field generated by the current flowing through the inductors 32 and 33 is less likely to be blocked by the metal member and the eddy current is less likely to be generated in metal member. Further, when viewed in plan view of the oscillator 1, the spacer member 80 and the inductors 32 and 33 do not overlap with each other, and furthermore, the spacer member 80 does not overlap with the guard ring 50 provided around the inductors 32 and 33, so the distance between the spacer member 80 and the inductors 32 and 33 is also increased. As a result, the magnetic field generated by the current flowing through the inductors 32 and 33 is less likely to be blocked by the spacer member 80 which is a conductor, and the eddy current is less likely to be generated in the spacer member 80. Therefore, according to the oscillator 1 of the second embodiment, the deterioration of the Q values of the inductors 32 and 33 is reduced, and the possibility of deterioration of the function as a circuit element is reduced.

Further, in the oscillator 1 according to the second embodiment, the metal members of the resonator 20 and the inductors 32 and 33 may be disposed so as to overlap with each other when viewed in plan view of the oscillator 1, so that it is possible to reduce the area of the integrated circuit element 10. Further, since the spacer member 80 which is a conductor not only functions as a member for securing the distance between the resonator 20 and the integrated circuit element 10, but also as a member for electrically coupling the resonator 20 and the integrated circuit element 10 to each other, there is no need to increase the area of the resonator 20 or the integrated circuit element 10 due to the spacer member 80. Therefore, according to the second embodiment, miniaturizing of the oscillator 1 can be realized.

Further, in the oscillator 1 of the second embodiment, like the oscillator 1 of the first embodiment, each circuit is disposed so as to be matched to flows of various signals in the integrated circuit element 10, and thus each of the wirings through which the various signals propagate is shortened. Therefore, according to the oscillator 1 of the second embodiment, parasitic capacitance of each wiring is reduced, and noise superimposed on each signal due to crosstalk with other signals or the like is reduced. Further, each wiring is shortened, and thus a wiring region becomes smaller as a whole, and thus the area of the integrated circuit element 10 is reduced.

Further, according to the second embodiment, since the two electrodes 26 provided on the outer surface of the base 23 of the resonator 20, and a pad functioning as an XG terminal and a pad functioning as an XD terminal provided on the integrated circuit element 10 can be coupled by the spacer member 80 which is a conductor, mounting of the oscillator 1 is easy.

1-3. Modification Example

For example, in the oscillator 1 according to the first embodiment described above, the integrated circuit element 10 has one PLL circuit including an inductor, but the integrated circuit element 10 may have two or more PLL circuits, and at least one inductor may overlap with the metal member of the resonator 20 when viewed in plan view of the oscillator 1. Further, in the oscillator 1 according to the second embodiment described above, the integrated circuit element 10 has one PLL circuit including an inductor, but the integrated circuit element 10 may have two or more PLL circuits, and at least one inductor may overlap with the metal member of the resonator 20 and all the inductors may not overlap with the spacer member 80 when viewed in plan view of the oscillator 1.

Further, for example, in the oscillator 1 of the first and second embodiments described above, although the inductors 32 and 33 constitute a part of the LC oscillator in the PLL circuit 14 of the integrated circuit element 10, the inductors may constitute a part of an LC filter or an LR filter in the PLL circuit.

Further, for example, in the oscillator 1 according to the first and second embodiments described above, although the lid 24 of the resonator 20 is a metal member, the lid 24 may not have the metal member. For example, the oscillator 1 may be an oscillator having a structure in which a resonator element is accommodated by a base made of silicon and a lid made of glass, or may be an oscillator or the like having a structure in which a resonator element is accommodated by a base and a lid both made of quartz crystal. In the oscillator 1 of these structures, the deterioration of the Q value of each inductor is reduced by providing the spacer member, and by disposing each inductor so as not to overlap with the electrode provided on the resonator element, for example.

Further, for example, in the oscillator 1 according to the first embodiment and the second embodiment described above, although the metal member included in the resonator 20 overlaps with the inductor, a lid made of a conductive member other than metal, an electrode of a resonator element, or the like may overlap with the inductor. In the case of a conductive member, an eddy current may be generated. However, by providing the spacer member, even when the conductive member and the inductor overlap with each other, it is difficult to generate an eddy current in the conductive member, and the deterioration of the Q value of the inductor is reduced.

2. Electronic Apparatus

Figure 11:
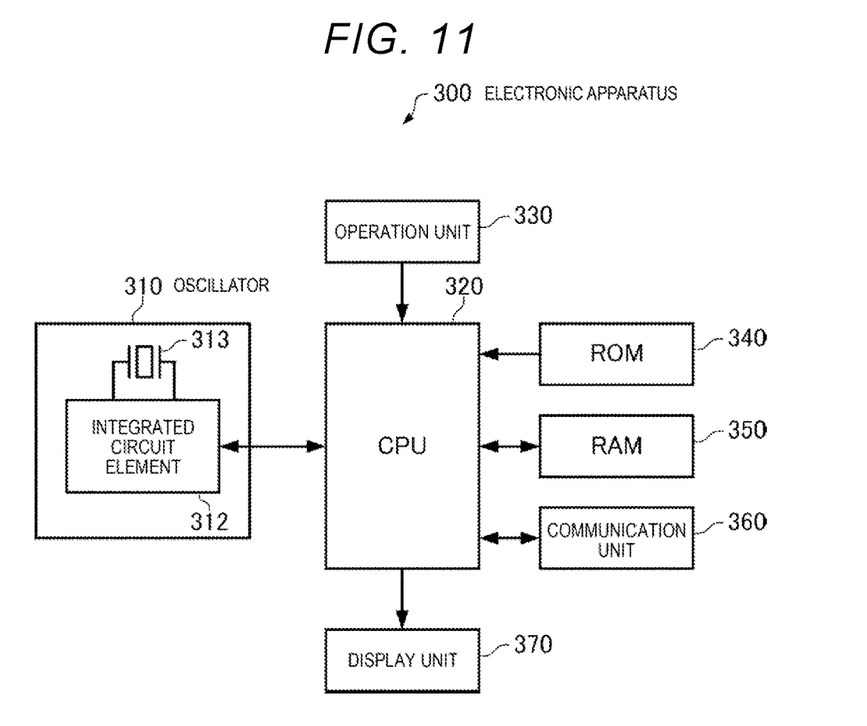
FIG. 11 is a functional block view of an electronic apparatus of the present embodiment.
Figure 12:
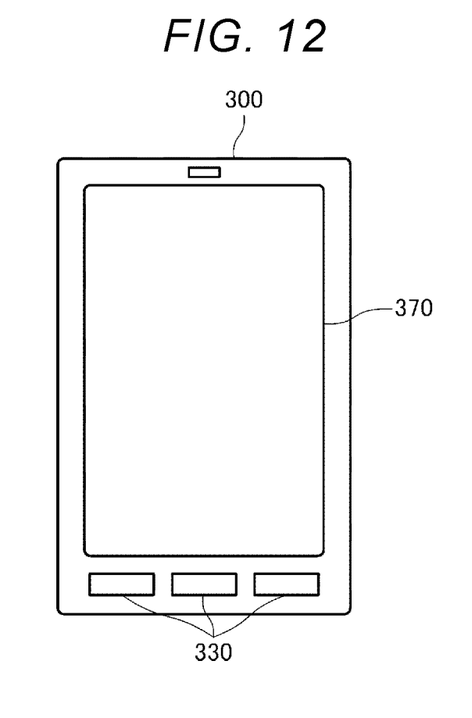
FIG. 12 is a view illustrating an example of an appearance of the electronic apparatus of the present embodiment.

FIG. 11 is a functional block view illustrating an example of a configuration of an electronic apparatus of the present embodiment. In addition, FIG. 12 is a view illustrating an example of the appearance of a smartphone which is an example of the electronic apparatus of the present embodiment.

An electronic apparatus 300 of the present embodiment is configured to include an oscillator 310, a central processing unit (CPU) 320, an operation unit 330, a read only memory (ROM) 340, a random access memory (RAM) 350, a communication unit 360, and a display unit 370. Note that the electronic apparatus of the present embodiment may be configured such that some of the components illustrated in FIG. 11 are omitted or changed, or other components are added thereto.

The oscillator 310 includes an integrated circuit element 312 and a resonator 313. The integrated circuit element 312 oscillates the resonator 313 to generate an oscillation signal. The oscillation signal is output from an external terminal of the oscillator 310 to the CPU 320. The integrated circuit element 312 has a PLL circuit not illustrated in the drawing, converts the frequency of the oscillation signal output from the resonator 313 by the PLL circuit, and outputs an oscillation signal having a frequency based on setting from the CPU 320.

The CPU 320 is a processing unit that performs various calculation processes and control processes by using the oscillation signal input from the oscillator 310 as a clock signal in accordance with programs stored in the ROM 340 and the like. Specifically, the CPU 320 performs various processes according to an operation signal from the operation unit 330, a process of controlling the communication unit 360 in order to perform data communication with an external device, a process of transmitting display signals for displaying various pieces of information on the display unit 370, and the like.

The operation unit 330 is an input device configured with operation keys, button switches, and the like, and outputs an operation signal according to a user's operation to the CPU 320.

The ROM 340 is a storage unit that stores programs, data, and the like for performing various calculation processes and control processes by the CPU 320.

The RAM 350 is a storage unit which is used as a work area of the CPU 320, and temporarily stores programs and data read out from the ROM 340, data input from the operation unit 330, results of computation executed by the CPU 320 in accordance with various programs, and the like.

The communication unit 360 performs various control processes for establishing data communication between the CPU 320 and an external device.

The display unit 370 is a display device configured with a liquid crystal display (LCD) and the like, and displays various pieces of information based on the display signals input from the CPU 320. A touch panel functioning as the operation unit 330 may be provided in the display unit 370.

By applying, for example, the oscillator 1 of the above-described each embodiment as the oscillator 310, it is possible to reduce a concern that a function as a circuit element is deteriorated due to the deterioration of a Q value of the inductor built into the integrated circuit element 312, and thus it is possible to implement the electronic apparatus with high reliability.

Various electronic apparatuses are conceived as the electronic apparatus 300, and may be, for example, a personal computer such as a mobile type personal computer, a laptop type personal computer, and a tablet type personal computer, a mobile terminal such as a smartphone or a mobile phone, a digital camera, an ink jet type ejection device such as an ink jet printer, a storage area network apparatus such as a router or a switch, a local area network apparatus, a mobile terminal base station apparatus, a television, a video camera, a video recorder, a car navigation device, a real-time clock device, a pager, an electronic organizer, an electronic dictionary, an electronic calculator, an electronic gaming machine, a gaming controller, a word processor, a workstation, a videophone, a security television monitor, electronic binoculars, a POS terminal, a medical apparatus such as an electronic thermometer, a sphygmomanometer, a blood glucose monitoring system, an electrocardiographic apparatus, an ultrasonic diagnostic apparatus, an electronic endoscope, a fish-finder, various measurement apparatuses, meters and gauges of automobiles, aircrafts, ships, and the like a flight simulator, a head mounted display, a motion tracer, a motion tracker, a motion controller, a pedestrian dead reckoning (PDR) apparatus, and the like.

As an example of the electronic apparatus 300 of the present embodiment, a transmission device functioning as a terminal base station apparatus communicating with, for example, a terminal in a wired or wireless manner, or the like by using the above-described oscillator 310 as a reference signal source is used. By applying, for example, the oscillator 1 of the above-described each embodiment as the oscillator 310, it is also possible to implement the electronic apparatus 300 which is usable in, for example, a communication base station and the like and is desired to have high frequency accuracy, high performance, and high reliability at lower costs than in the related art.

In addition, another example of the electronic apparatus 300 of the present embodiment may be a communication device including a frequency control unit in which the communication unit 360 receives an external clock signal and the CPU 320 controls the frequency of the oscillator 310 based on the external clock signal and an output signal of the oscillator 310. The communication device may be a communication apparatus which is used in a backbone network apparatus such as a stratum 3, or a femtocell.

3. Vehicle

Figure 13:
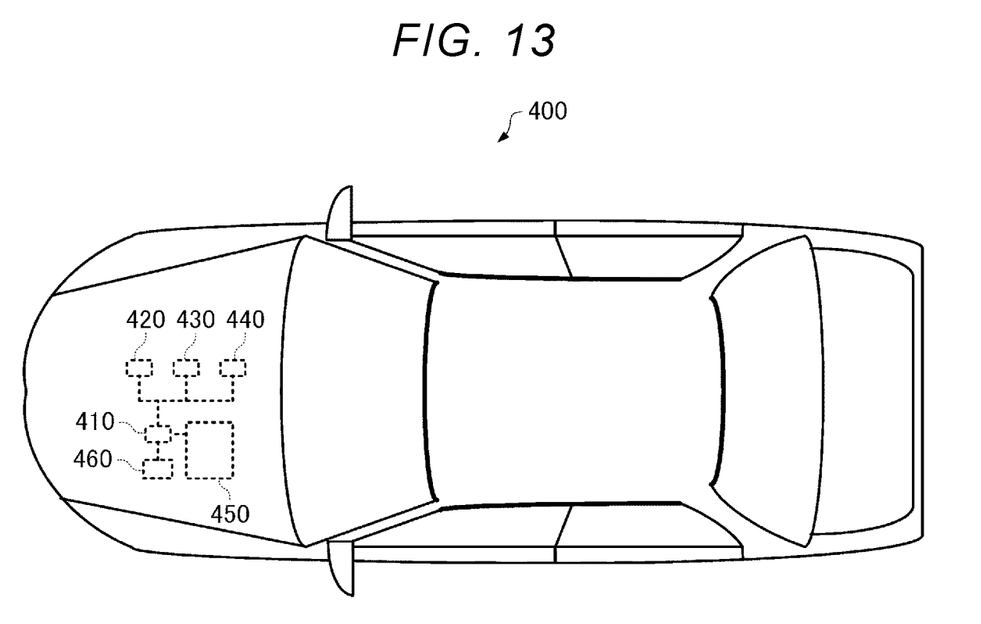
FIG. 13 is a view illustrating an example of a vehicle according to the present embodiment.

FIG. 13 is a view illustrating an example of a vehicle of the present embodiment. A vehicle 400 illustrated in FIG. 13 is configured to include an oscillator 410, controllers 420, 430, and 440, such as an engine system, a brake system, and a keyless entry system, which perform various control processes, a battery 450, and a back up battery 460. Note that the vehicle of the present embodiment may be configured such that some of the components illustrated in FIG. 13 are omitted, or other components are added thereto.

The oscillator 410 includes an integrated circuit element and a resonator not illustrated in the drawing, and the integrated circuit element oscillates the resonator to generate an oscillation signal. The oscillation signal is output to the controllers 420, 430, and 440 from an external terminal of the oscillator 410, and is used as, for example, a clock signal. The integrated circuit element has a PLL circuit not illustrated in the drawing, converts the frequency of the oscillation signal output from the resonator by the PLL circuit, and outputs an oscillation signal having a frequency based on setting.

The battery 450 supplies power to the oscillator 410 and the controllers 420, 430, and 440. The back up battery 460 supplies power to the oscillator 410 and the controllers 420, 430, and 440 when an output voltage of the battery 450 falls below a threshold value.

By applying, for example, the oscillator 1 of the above-described each embodiment as the oscillator 410, it is possible to reduce a concern that a function as a circuit element is deteriorated due to the deterioration of a Q value of an inductor built into the integrated circuit element of the oscillator 410, and thus it is possible to implement the vehicle with high reliability.

Various vehicles are conceived as the vehicle 400, and may be, for example, an automobile such as an electric car, an aircraft such as a jet plane or a helicopter, a ship, a rocket, an artificial satellite, and the like.

The present disclosure is not limited to the present embodiment, various modifications can be made without departing from the scope of the disclosure.

The above-described embodiments and modification example are just examples, and the disclosure is not limited thereto. For example, each embodiment and the modification example may also be appropriately combined with each other.

The present disclosure includes substantially the same configurations, for example, configurations having the same functions, methods and results, or configurations having the same objects and effects, as the configurations described in the embodiments. In addition, the present disclosure includes a configuration obtained by replacing non-essential portions in the configurations described in the embodiments. Further, the present disclosure includes a configuration that exhibits the same operational effects as those of the configurations described in the embodiments or a configuration capable of achieving the same objects. The present disclosure includes a configuration obtained by adding the configurations described in the embodiments to known techniques.

What is claimed is:

1. An oscillator comprising:
a resonator which includes a resonator element and a resonator element container accommodating the resonator element;
an integrated circuit element which includes an inductor; and
a nonconductive spacer member,
wherein:
the resonator is stacked above the integrated circuit element, the resonator has a metal member,
the spacer member is provided between the resonator and the integrated circuit element, and
a thickness of the spacer member is ½ or more of an outer diameter of the inductor.

2. The oscillator according to claim 1, wherein
the resonator element container includes
a base provided with a concave portion in which the resonator element is accommodated, and
a lid which is the metal member, and
the resonator is mounted over the spacer member such that the lid faces the integrated circuit element.

3. An oscillator comprising:
a resonator which includes a resonator element and a resonator element container accommodating the resonator element;
an integrated circuit element which includes an inductor; and
a conductive spacer member,
wherein:
the resonator is stacked above the integrated circuit element,
the resonator has a metal member,
the spacer member is provided between the resonator and the integrated circuit element, and electrically couples the resonator and the integrated circuit element to each other,
the spacer member and the inductor do not overlap with each other when viewed in plan view,
the integrated circuit element includes a guard ring provided around the inductor, and
the spacer member does not overlap with the guard ring when viewed in plan view.

4. The oscillator according to claim 3, wherein
the resonator element container includes
a base provided with a concave portion in which the resonator element is accommodated, and
a lid which is the metal member, and
the resonator is mounted over the integrated circuit element through the spacer member such that the base faces the integrated circuit element.

5. The oscillator according to claim 1, wherein
the inductor and the metal member overlap with each other when viewed in plan view.

6. The oscillator according to claim 3, wherein
the inductor and the metal member overlap with each other when viewed in plan view.

7. The oscillator according to claim 1, wherein
a thickness of the spacer member is 1 millimeter or less.

8. The oscillator according to claim 3, wherein
a thickness of the spacer member is 1 millimeter or less.

9. An electronic apparatus comprising the oscillator according to claim 1.

10. A vehicle comprising the oscillator according to claim 1.

* * * * *